(12) United States Patent
Koch

(10) Patent No.: US 8,217,642 B2
(45) Date of Patent: Jul. 10, 2012

(54) CURRENT SENSOR ARRANGEMENT FOR MEASUREMENT OF CURRENTS IN A PRIMARY CONDUCTOR

(75) Inventor: Ralf Koch, Freiensteinau (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 397 days.

(21) Appl. No.: 12/487,897

(22) Filed: Jun. 19, 2009

(65) Prior Publication Data

US 2009/0315536 A1    Dec. 24, 2009

(51) Int. Cl.
*G01R 15/18* (2006.01)

(52) U.S. Cl. ............... 324/117 R; 324/126; 324/127; 330/8

(58) Field of Classification Search .............. None
See application file for complete search history.

(56) References Cited

U.S. PATENT DOCUMENTS

| | | | | |
|---|---|---|---|---|
| 4,639,665 A | * | 1/1987 | Gary | 324/117 H |
| 4,785,236 A | * | 11/1988 | Balogh et al. | 324/120 |
| 5,450,000 A | * | 9/1995 | Olsen | 323/222 |
| 5,565,765 A | * | 10/1996 | Lenhard | 324/117 R |
| 5,602,464 A | * | 2/1997 | Linkowsky et al. | 323/272 |
| 5,811,965 A | * | 9/1998 | Gu | 324/117 R |
| 5,828,295 A | * | 10/1998 | Mittel et al. | 340/407.1 |
| 6,177,791 B1 | * | 1/2001 | Lenhard | 323/357 |
| 6,713,999 B1 | * | 3/2004 | Lenhard et al. | 324/117 R |
| 7,071,678 B2 | * | 7/2006 | Karlsson et al. | 324/117 R |
| 7,256,574 B2 | * | 8/2007 | Teulings et al. | 324/117 R |
| 7,528,594 B2 | * | 5/2009 | Manzoli et al. | 324/127 |

\* cited by examiner

*Primary Examiner* — Richard Isla Rodas
(74) *Attorney, Agent, or Firm* — Buchanan, Ingersoll & Rooney PC

(57) ABSTRACT

A method and current sensor arrangement for measurement of a primary current in a primary conductor which is magnetically coupled to a secondary conductor via a ferromagnetic core, with a voltage of a specific amplitude being applied to the secondary conductor, such that a secondary current flows for remagnetization of the ferromagnetic core, and the secondary current is measured during the remagnetization of the core, in order to obtain a first measured value. The voltage polarity is then reversed such that a secondary current flows for renewed remagnetization of the ferromagnetic core, and the secondary current is measured during the remagnetization of the core, in order to obtain a second measured value. The primary current is calculated as a function of the first and of the second measured value, with the polarity reversal being carried out at least once at a time which occurs before that time at which the ferromagnetic core reaches its saturation magnetization.

18 Claims, 8 Drawing Sheets

CURRENT SENSOR ARRANGEMENT FOR MEASUREMENT OF CURRENTS IN A PRIMARY CONDUCTOR

BACKGROUND

1. Field

Disclosed herein is a current sensor arrangement for measurement of currents in a primary conductor over a wide measurement range.

2. Description of Related Art

On the one hand, so-called direct-mapping current sensors are known for non-contacting, and therefore electrically floating measurement of the level of an electric current in a conductor, which sensors sense the magnetic flux caused by the current, for example by means of a Hall sensor in a slotted magnetic circuit, and produce a signal which is proportional to the current level. These sensors are highly cost-effective, but are relatively inaccurate. Direct-mapping current sensors are so-called open-loop current sensors which do not contain a closed control loop.

Furthermore, so-called closed-loop current sensors are known, in which a closed control loop is used to continuously produce a magnetic opposing field of the same magnitude as the current to be measured as a result of which complete magnetic-field compensation occurs, and the magnitude of the current to be measured can be deduced from the parameters to produce the opposing field. Closed-loop current sensors therefore belong to the class of compensation current sensors.

One special type of compensation current sensors which, however, do not contain a closed control loop is flux gate sensors which are described, for example, in the document DE 42 29 948. Since current sensors such as these avoid any hysteresis error, they are suitable for precise current measurement over a wide dynamic range from a few milliamperes up to about one kiloampere.

Flux gate sensors do not allow continuous current measurement, but the output signal of the sensor is a periodic signal which is sampled at specific sampling times. The sample values represent the current in the primary conductor (primary current) at the discrete sampling times.

In the case of the known flux gate sensor, the sampling frequency is predetermined by the oscillation frequency of the sensor (sensor frequency) and in consequence by the inductance of the sensor arrangement. The inductance is frequently chosen to be high, in order to make the sensor less sensitive to disturbances, as a result of which, however, the sensor frequency is relatively low. Although the inductance could be reduced, and the sensor frequency increased, by using small coils and coil cores, this is frequently not feasible because of the increased susceptibility of relatively small cores to disturbance. The actual design of conventional flux gate sensors is therefore always a compromise between the contradictory design aims of high sensor frequency (and therefore high time resolution) on the one hand and high inductance (because of the reduced susceptibility to disturbances) on the other hand. The sensor design is defined for a specific application and cannot be changed during operation.

One problem with the known flux gate sensors is the high maximum current draw resulting from the periodic complete remagnetization of the magnet system of the flux gate sensor, which results in the use of flux gate sensors being of little interest, for financial reasons, for many applications.

A further problem can occur when the frequency of the primary current is similar to or equal to the sensor frequency, or is an integer multiple of it. Beatings can then be observed in the sampled output signal of the sensor as a result of aliasing effects, and these beatings are in a frequency range which may be important for the current measurement. These beatings obviously interfere with the measurement. This interference may be of such an extent that worthwhile current measurement is impossible in some cases, thus greatly restricting the practical field of application of the current sensor.

SUMMARY

There is therefore a need to provide a flexible current sensor arrangement for measurement of currents in a primary conductor, in which the problems described above do not occur.

One embodiment disclosed herein relates to a current sensor arrangement for measurement of a primary current in a primary conductor disclosed herein, has the following components: a ferromagnetic core for magnetic coupling of the primary conductor to a secondary conductor; a controlled voltage source which is connected to the secondary conductor; a drive device, which is connected to the secondary conductor, for regular remagnetization of the ferromagnetic core, with the drive device having a controlled voltage source which is connected to the secondary conductor and is designed to provide a bipolar voltage of a specific amplitude, such that a resultant secondary current causes remagnetization of the ferromagnetic core; and a control device for controlling the voltage source, with the control device being designed to reverse the polarity of the voltage source at least once at a time which occurs before that time at which the ferromagnetic core reaches its saturation magnetization. Since the remagnetization process does not pass through the complete hysteresis characteristic of the ferromagnetic core, this is also referred to as a partial hysteresis method for current measurement.

A further embodiment relates to a method for measurement of a primary current in a primary conductor which is magnetically coupled to a secondary conductor via a ferromagnetic core, having the following steps:

application of a voltage of a specific amplitude to the secondary conductor, such that a secondary current flows in order to remagnetize the ferromagnetic core;

measurement of the secondary current during the remagnetization of the core in order to obtain a first measured value; reversal of the polarity of the voltage, such that a secondary current flows for renewed remagnetization of the ferromagnetic core;

measurement of the secondary current during the remagnetization of the core, in order to obtain a second measured value; calculation of the primary current as a function of the first and of the second measured value, with the polarity reversal being carried out at least once at a time which occurs before that time at which the ferromagnetic core reaches its saturation magnetization.

BRIEF DESCRIPTION OF DRAWINGS

The invention will be explained in more detail in the following text with reference to figures, in which the same reference symbols denote the same components and/or signals. In the figures.

DETAILED DESCRIPTION OF SPECIFIC EMBODIMENTS

Figure 1A:
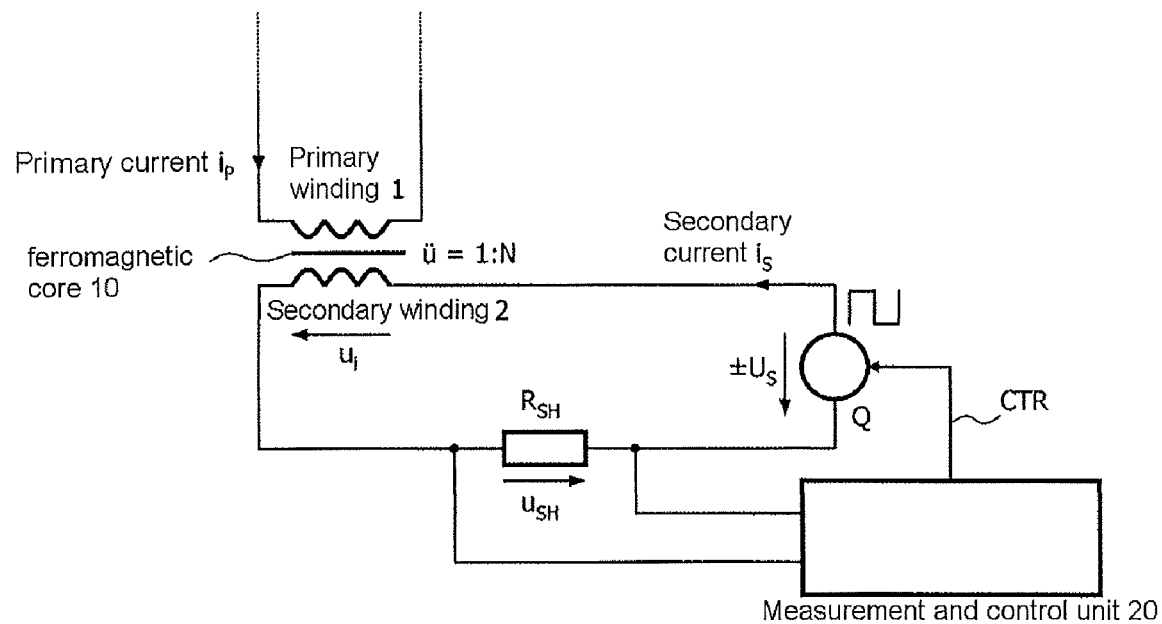
FIGS. 1a and 1b show two schematic diagrams of embodiments of the current sensor arrangement described herein.

FIG. 1a uses a diagram to show the basic design of a compensation current sensor without any hysteresis error. The current to be measured (primary current $i_P$) flows through a primary winding 1 which is magnetically coupled to a secondary winding 2 (number of turns N) via a soft-magnetic and, for example, unslotted core 10. By way of example, the primary winding 1 may comprise one single turn, that is to say the primary winding 1 is formed from a conductor which is passed through the core 10 (number of turns 1). The secondary winding 2 is connected in series with a controlled voltage source Q, which produces the secondary current $i_S$ through the secondary winding and which is capable of reversing polarity. In order to measure the secondary current $i_S$, a shunt resistor $R_{SH}$ is connected between the secondary winding 2 and the voltage source Q. The voltage $U_{SH}$ across the shunt resistor $R_{SH}$ is supplied to a measurement and control unit 20, which also provides a control signal CTR for driving the controlled voltage source Q.

Figure 1B:
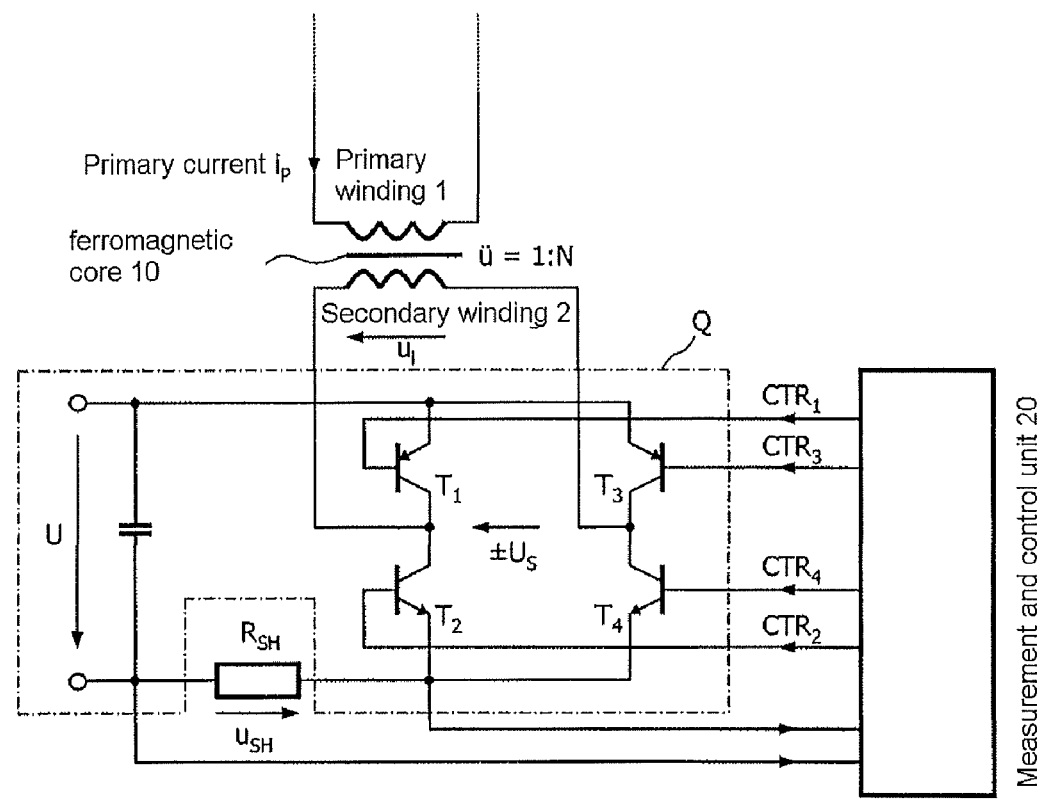

FIG. 1b is a schematic diagram that shows the example from FIG. 1a with an exemplary embodiment of the controlled voltage source Q (indicated by the dashed-line box and the components within it). In this example, the polarity of the supply DC voltage U is set with the aid of a transistor full bridge comprising the transistors $T_1$ to $T_4$, as a function of control signals $CTR_1$ to $CTR_4$ which are produced by the measurement and control unit 20. The measurement and control unit 20 is therefore able to reverse the polarity of the supply DC voltage U as a function of control signals. Since the load on the secondary winding 2 is inductive, the transistors $T_1$ to $T_4$ each require a freewheeling diode. For the sake of clarity, these diodes are not separately illustrated in FIG. 1b.

Figure 2A:
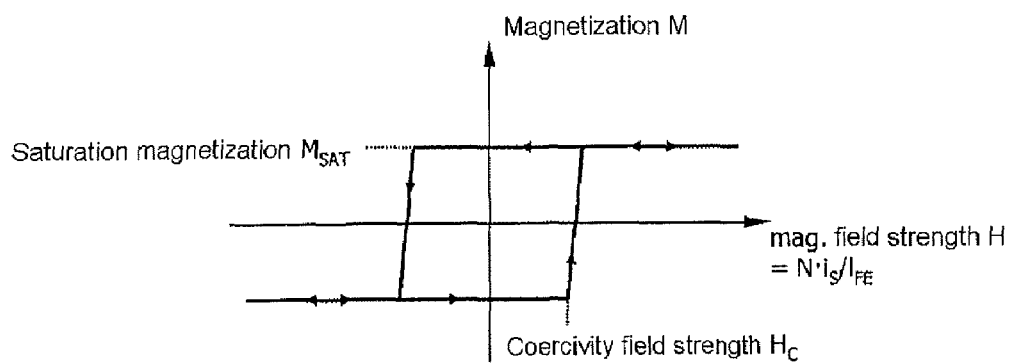
FIGS. 2a and 2b show a graph of the magnetization and magnetic field strength, and a graph of the signal profile of the secondary current, respectively, of a freely oscillating current sensor arrangement with a primary current of zero.

The method of operation of the current measurement arrangements illustrated in FIGS. 1a and 1b will be described with reference to FIGS. 2 to 4. FIG. 2a describes the ferromagnetic characteristics of the soft-magnetic core 10 on the basis of a magnetization characteristic, with the magnetic field strength H being plotted on the abscissa, and the magnetization M being plotted on the ordinate. The magnetization characteristic has an approximately square hysteresis with a specific coercivity field strength $H_C$ and a specific saturation magnetization $M_{SAT}$. In accordance with Ampere's law, the magnetic field strength H is given in a simplified form by $H = N \cdot i_S / l_{FE}$, while the parameter $l_{FE}$ denotes the magnetic path length of the magnetic lines of force in the ferromagnetic core 10.

In accordance with Faraday's law, the voltage ui induced in the secondary coil 2 is given by:

$$u_i = -N \cdot d\Phi/dt = -N \cdot A \cdot dB/dt, \qquad (1)$$

where the parameter A denotes the cross-sectional area of the ferromagnetic core 10, the symbol $\Phi$ denotes the magnetic flux through the core 10 caused by the secondary current iS, and the symbol B denotes the magnetic flux density. The magnetic flux density B can be represented in a general form by the relationship $B = \mu_0 \cdot (H+M)$; this means that the rate of change of the magnetization dM/dt during remagnetization of the ferromagnetic core 10 (which corresponds to the left-hand or right-hand vertical branch of the magnetization characteristic in FIG. 2a) is proportional to the induced voltage $u_i$, and that the magnetic field strength H, and therefore also the secondary current $i_S$ are in this case constant, that is to say:

$$u_i = -N \cdot A \cdot \mu_0 \cdot dM/dt \text{ (on remagnetization)} \qquad (2)$$

It can also be said that the differential inductance of the secondary coil 2 is virtually infinitely high during the remagnetization. As soon as the magnetization in the ferromagnetic core 10 has reached the saturation magnetization $M_{SAT}$, the secondary current $i_S$ rises, and is no longer limited by the pure resistance of the secondary winding 2 and the shunt resistor $R_{SH}$.

Figure 2B:
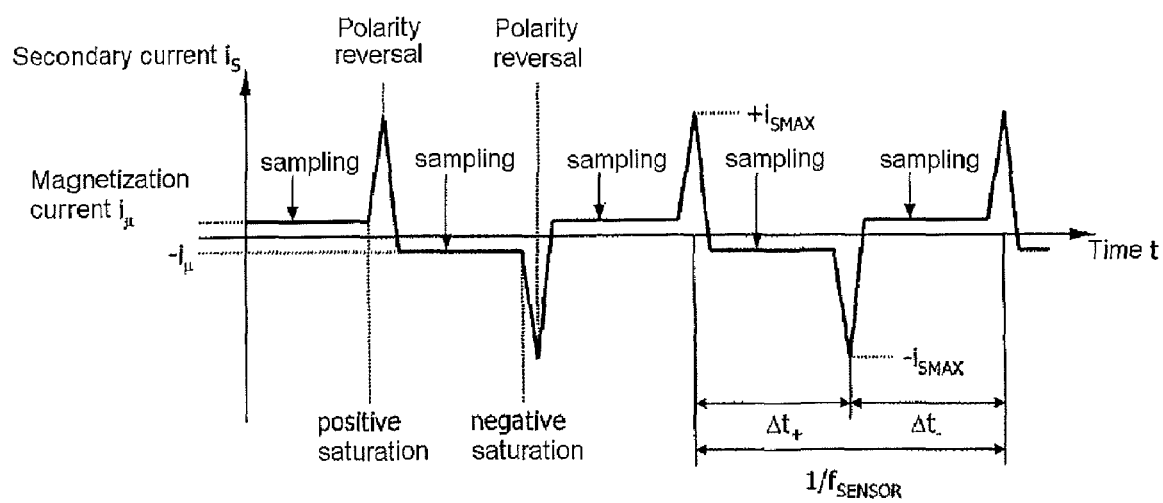

The rise in the secondary current $i_S$ is identified by the measurement and control unit 20, for example with the aid of comparators (cf. FIG. 2b). As soon as the secondary current exceeds a positive threshold value $+i_{SMAX}$ or falls below a negative threshold value $-i_{SMAX}$, the measurement and control unit 20 produces an appropriate control signal CTR in order to reverse the polarity of the voltage source Q, and to initiate the next remagnetization cycle.

The time profile of the secondary current for a primary current $i_P$ of zero is illustrated in FIG. 2b. During the remagnetization (cf. the approximately vertical branches of the magnetization characteristic from FIG. 2a), the secondary current is constant and corresponds to the magnetization current $+i_\mu$ or $-i_\mu$. The magnitude of the magnetization current $i_\mu$ depends on the width of the hysteresis in the magnetization characteristic, that is to say on the coercivity field strength $H_C$, that is to say $i_\mu = l_{FE}/N \cdot H_C$. As soon as the magnetization in the ferromagnetic core 10 reaches the positive or negative saturation magnetization, the secondary current is starts to rise, as already described above. Because of the symmetry of the hysteresis characteristic, the time profile of the secondary current $i_S$ is also symmetrical about a mean current value.

Figure 3A:
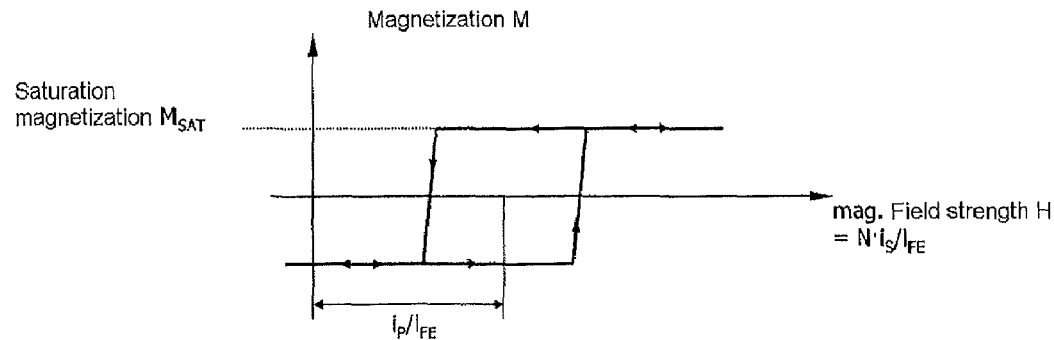
FIGS. 3a and 3b show a graph of the magnetization and magnetic field strength, and a graph of the signal profile of the secondary current, respectively, of a freely oscillating current sensor arrangement with a primary current greater than zero.
Figure 3B:
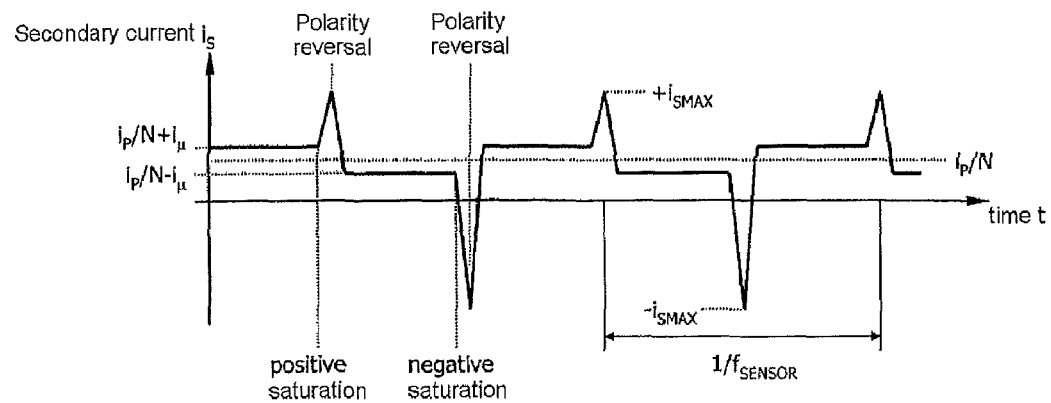

FIGS. 3a and 3b show a similar situation to that shown in FIGS. 2a and 2b, but for a primary current $i_P$ which is not equal to zero. The magnetic field produced by the primary current $i_P$ is additively superimposed in the soft-magnetic core 10 on the magnetic field of the secondary current $i_S$, and this can be represented as a shift of the magnetization characteristic along the abscissa. This situation is illustrated diagrammatically in FIG. 3a. The corresponding time profile of the secondary current is illustrated in FIG. 3b. This is similar to that in FIG. 2b for a primary current of zero with the difference that the secondary current is no longer symmetrical about the abscissa ($i_S = 0$) but instead is symmetrical about the horizontal straight line ($i_S = i_P/N$). This means that, during the remagnetization, the primary current and the secondary current have the same ratio ü=1:N as the number of turns of the primary winding 1 and the secondary winding 2, with the exception of the hysteresis offset at the level of the magnetization current $i_\mu$. For current measurement, the secondary current signal $i_S$, strictly speaking the voltage signal $u_{SH}$ across the shunt resistor $R_{SH}$, is sampled during the remagnetization process. A current measured value $i_S[n-1]=(i_P/N)+i_\mu$ is therefore obtained in the first half of one period of the secondary current, and a current measured value $i_S[n]=(i_P/N)-i_\mu$ in the second period half. The hysteresis error, which is caused by the magnetization current, can be eliminated by averaging, and the primary current at a sampling time n is calculated as follows:

$$i_P[n]=N\cdot(i_S[n-1]+i_S[n])/2. \quad (3)$$

Since the hysteresis of the magnetization characteristic has no influence on the measurement result, this current measurement method is very highly suitable for measurement of very small currents. The measurement range extends from a few milliamperes up to one kiloampere. During the remagnetization process in the ferromagnetic core 10, the secondary current $i_S$ follows the primary current $i_P$ corresponding to the transformation ratio 1: ü. During this process, the secondary current is sampled at least once, in order to obtain a measured value ($i_S+i_\mu$ or $i_S-i_\mu$) to calculate the primary current. However, the sampling can also be carried out repeatedly during the remagnetization process at a sampling rate which is considerably higher than the oscillation frequency of the sensor itself, for example at sampling frequencies between 1 kHz and 1 MHz. It is therefore possible to also detect transient processes in the primary current signal $i_P$, provided that these transient processes occur during the remagnetization. No worthwhile current measurement is possible while the ferromagnetic core 10 is magnetically saturated.

Owing to the fact that the current sensor arrangement described above does not allow continuous measurement, but the secondary current is sampled only at discrete times, undesirable aliasing effects can occur which are manifested in the measurement result primarily as low-frequency beatings. By way of example, the sampling can always be initiated at a fixed time after the polarity reversal of the voltage $U_S$ from the current source Q, in which case the time can be chosen to be sufficiently short that the secondary current $i_S$ has stabilized, that is to say it is following the primary current $i_P$. The aliasing problem that has been mentioned is illustrated, by way of example, in FIG. 4.

If the frequency of the primary current $i_P$ is equal to or is at least approximately the same as the oscillation frequency of the sensor arrangement, that is to say of the secondary current $i_S$, or is an integer multiple of it, then undesirable beatings can be superimposed on the measurement signal, as a result of which no worthwhile measurement is possible. In the present case, the primary current $i_P$ is modulated with a square-wave signal whose frequency is in a similar order of magnitude to twice the oscillation frequency $f_{SENSOR}$ of the current sensor, that is to say close to the sampling frequency. In this case, this results in aliasing effects which appear as low-frequency beatings in a frequency range which is important for the measurement.

Figure 4:
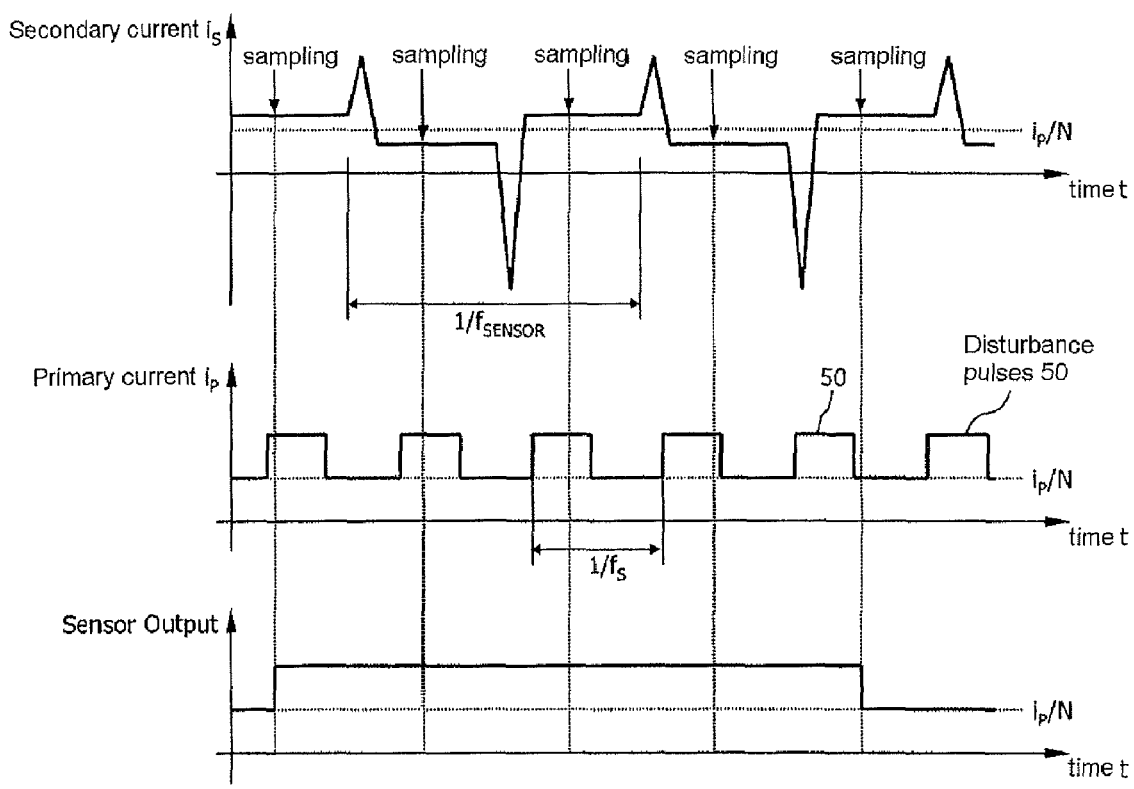
FIG. 4 is a graph showing an example of an aliasing effect, which can occur depending upon the signal profiles of the primary current and secondary current and which is effectively avoided by the embodiments described herein.

In the example shown in FIG. 4, disturbance pulses 50 are superimposed on the primary current $i_P$, and are repeated at a frequency $f_S$. The frequency $f_S$ of the disturbance pulses 50 is in a similar order of magnitude to twice the sensor oscillation frequency $f_{SENSOR}$. The difference between $f_S$ and $2f_{SENSOR}$ is actually of such a magnitude that beating results at beating frequency of about half the sensor frequency. If the difference were less, the beating frequency would clearly be even lower.

However, it is impossible to use an anti-aliasing filter, such as that used in communication systems, in a current sensor arrangement such as this.

As can be seen from equation (2), as the amplitude $U_S$ of the voltage produced by the voltage source Q increases, the speed of the remagnetization process also increases, because, from equation (2):

$$dM/dt=-u_i/(N\cdot A\cdot\mu_0)=-(U_S-R_{SH}\cdot i_S)/(N\cdot A\cdot\mu_0). \quad (4)$$

In consequence, the oscillation frequency of the secondary current increases as the amplitude $U_S$ of the voltage which is produced by the voltage source Q increases. The oscillation frequency $f_{SENSOR}$ of the sensor follows from equation (4):

$$f_{SENSOR}=\Delta t_++\Delta t_-, \quad (5a)$$

where $$\Delta t_+=(\mu_0\cdot\Delta M\cdot N\cdot A)/(U_S-i_P\cdot R_{SH}/N) \quad (5b)$$

$$\Delta t_-=(\mu_0\cdot\Delta M\cdot N\cdot A)/(U_S+i_P\cdot R_{SH}/N). \quad (5c)$$

The parameter $\Delta M$ is, in this case, the magnetization change during a remagnetization process. As can be seen from equations (5a) and (5b), the oscillation frequency $f_{SENSOR}$ of the sensors depends on the one hand on the primary current itself, and on the voltage amplitude $U_S$ of the voltage produced by the voltage source Q, and on the magnetization change $\Delta M$.

If, in one specific application, the signal frequency of the primary current $i_P$ is similar or equal to the oscillation frequency $f_{SENSOR}$ of the sensor, or is a multiple of it, then, in order to avoid the undesirable aliasing effect described in FIG. 4, the oscillation frequency $f_{SENSOR}$ can be appropriately adapted by changing the voltage amplitude $U_S$ or the magnetization change $\Delta M$, in order to avoid undesirable effects.

In the case of a freely oscillating current sensor arrangement, the secondary current profile of which is shown in FIG. 2, the magnetization change $\Delta M$ is predetermined by the saturation magnetization MSAT ($\Delta M=2\cdot M_{SAT}$), which means that the oscillation frequency $f_{SENSOR}$ can easily be varied, in a simple manner, by varying the voltage amplitude $U_S$ of the current source Q. By way of example, the voltage amplitude is controlled by means of a control signal from the measurement and control unit 20 such that the oscillation frequency $f_{SENSOR}$ of the current sensor arrangement varies continuously during operation. This makes it possible to ensure that a disturbance 50 at one specific frequency in the sampled sensor signal (measurement signal) no longer appears as beating. Instead of this, only more irregular disturbance pulses can be seen in the measurement signal, but these do not have any serious adverse effect on the measurement—in contrast to beating.

Figure 6:
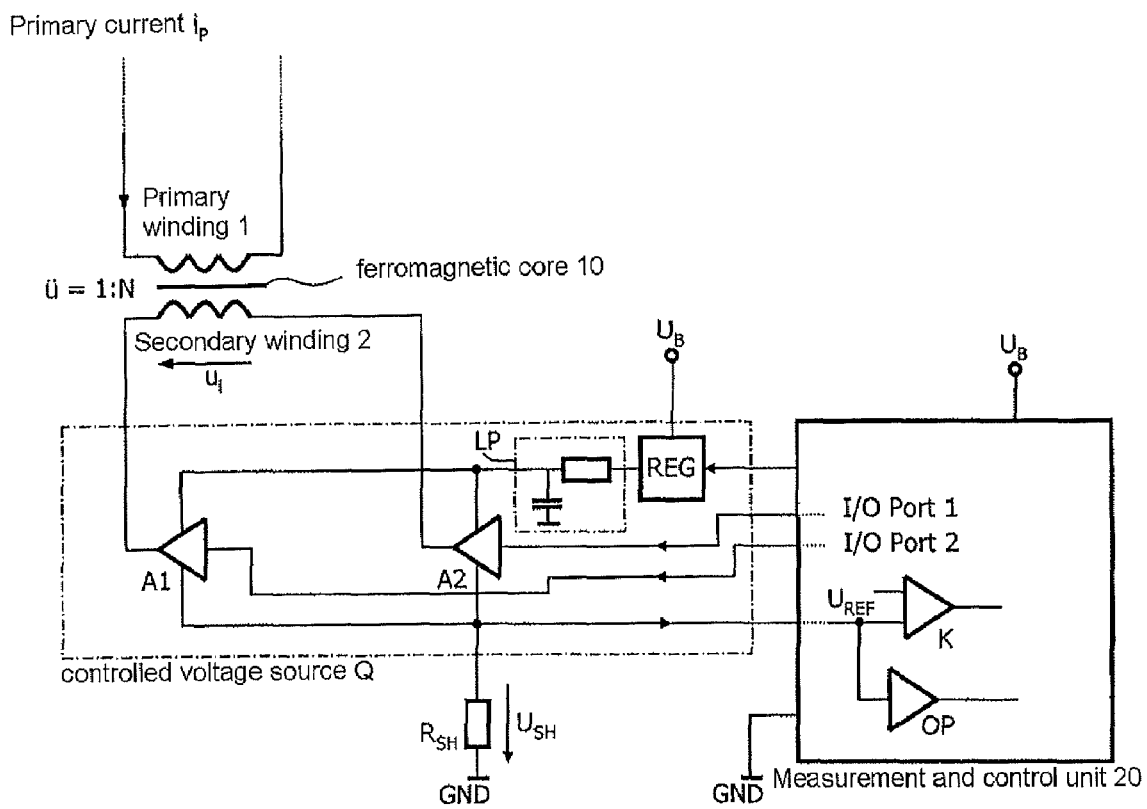
FIG. 6 is a schematic diagram which shows an exemplary embodiment from FIG. 1 in detail.

The variation or adaptation of the sensor frequency $f_{SENSOR}$ is controlled by the measurement and control unit 20 (cf. FIGS. 1 and 6). By way of example, the measurement and control unit 20 may be designed to stochastically vary the sensor frequency $f_{SENSOR}$. Alternatively, the sensor frequency $f_{SENSOR}$ may also be varied in accordance with a specific, predetermined frequency pattern. This is achieved, by way of example, by virtue of the fact that the control device amplitude-modulates the amplitude of the voltage source Q (see FIG. 1), thereby frequency-modulating the sensor frequency $f_{SENSOR}$. In general, the sensor frequency can be changed in a specific range by varying the voltage amplitude of the voltage source Q (cf. equations 5a-c). If the frequency $f_S$ of a disturbance 50 (cf. FIG. 4) is known, it may be worthwhile designing the measurement and control unit 20 such that the sensor frequency $f_{SENSOR}$, or an integer multiple of it, differs to such a great extent from the frequency $f_S$ of the disturbance 50 that the resultant beating occurs in a frequency range which is not relevant for the measurement, for example in a frequency range above the frequency range of interest for the measurement.

Variation of the sensor frequency admittedly resolves or reduces the negative effects of any aliasing effects which may be present, but the current draw of free-running flux gate sensors, for example as explained in FIG. 4, is relatively high, which makes the use of these sensors uninteresting for many applications.

Figure 5A:
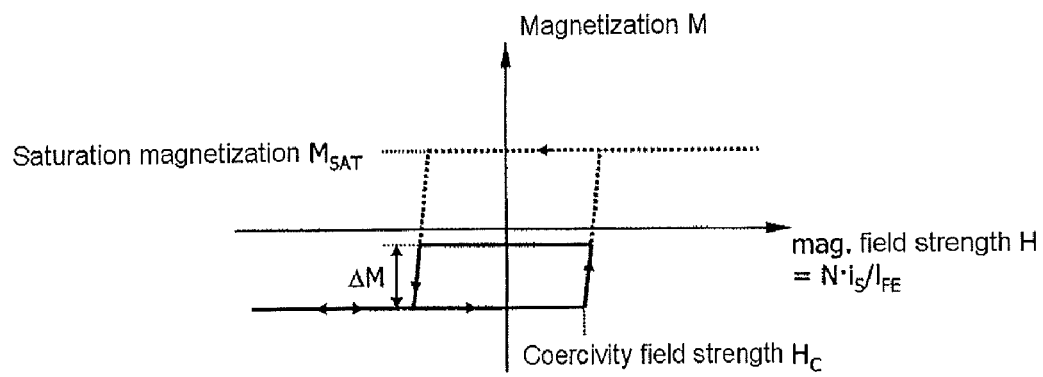
FIGS. 5a and 5b show a graph of the magnetization and of the magnetic field strength and a graph of the signal profile of the secondary current, respectively of a current sensor arrangement in the partial hysteresis mode with a primary current of zero.
Figure 5B:
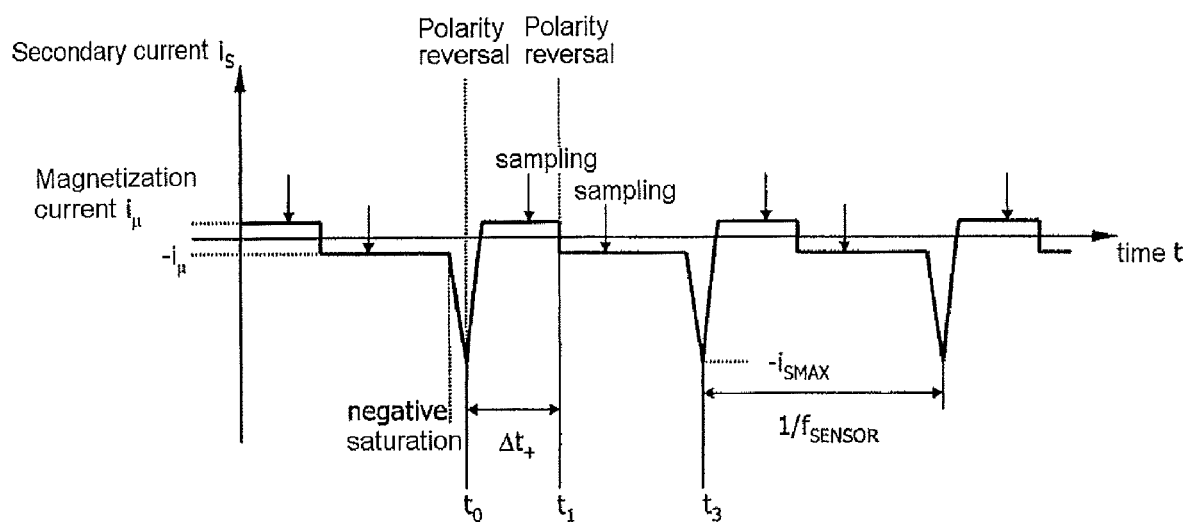
Figure 5C:
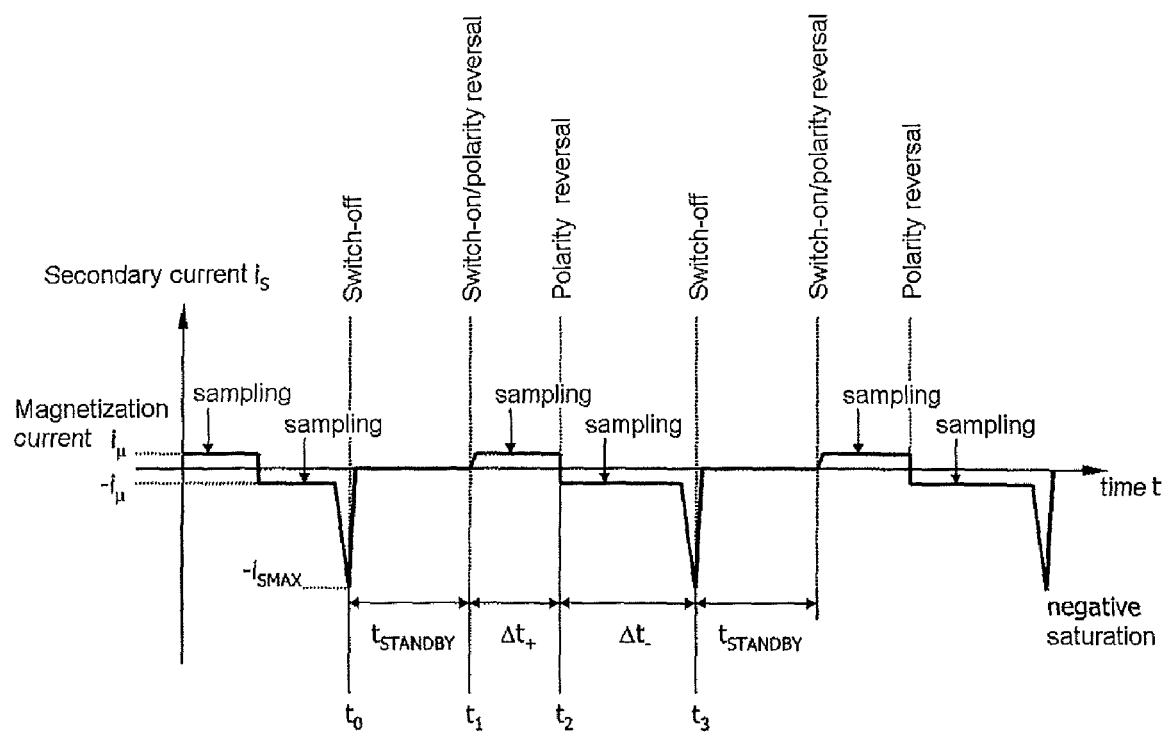
FIG. 5c shows a variant of the mode of operation of FIG. 5b.

FIGS. 5*a-c* relate to a so-called partial hysteresis method for operation of a flux gate sensor, in which the current draw is significantly reduced in comparison to that of known flux gate sensors.

As can be seen in FIGS. 3*b*, 4 and 5*b*, the desired information about the primary current $i_P$ already exists and can be read in the secondary current $i_S$, long before passing through the entire hysteresis curve. The complete remagnetization of the coil core 10, which in fact is the major reason for the high power consumption of free-running flux gate sensors, is therefore not necessary for actual measured-value detection.

An advantageous reduction in the power consumption of the current sensor can therefore be achieved by not waiting for the magnet core 10 to be completely saturated (as in the case of the example shown in FIG. 4) before reversing the polarity of the voltage of the voltage source Q, but by reversing the polarity again before then. This means that the time interval $\Delta t_+$ (or alternatively $\Delta t_-$) of one period of the secondary current $i_S$ is predetermined directly by the measurement and control unit 20 and is not determined, as in the example in FIG. 4, by a threshold value of a comparator. As has already been explained above, the magnetization change $\Delta M$ is thus defined directly (cf. equation 5a or 5b). In the case of the partial hysteresis mode of the flux gate sensor arrangement, at least the remagnetization process in one direction is carried out on a time-controlled basis. This means that the process no longer passes through the entire hysteresis of the magnetization characteristic (cf. FIGS. 2*a* and 3*a*) but only a part of the hysteresis, for example 20 to 30 percent. This is indicated by a comparison of the dashed line and the solid line hysteresis loops in FIG. 5*a*. Since, in comparison to a freely oscillating sensor arrangement, only a fraction of the magnetization change $\Delta M$ occurs, the current draw and the power loss in the partial hysteresis mode are considerably less than in the case of a freely oscillating sensor arrangement.

In the case of the partial hysteresis method, at least the part $\Delta t_+$, or alternatively $\Delta t$, of the period duration $f_{SENSOR}^{-1}$ of the sensor oscillation frequency is predetermined, that is to say the polarity of the voltage source Q is reversed after a specific time $\Delta t^+$, before the ferromagnetic core 10 reaches its saturation magnetization $M_{SAT}$. The soft-magnetic core 10 is then once again remagnetized to the saturation magnetization $-M_{SAT}$, and the cycle starts again. In principle, the remagnetization could also be carried out on a time-controlled basis in both directions, but it is then possible for the part of the hysteresis curve which is actually passed through to "drift" as a result of unavoidable inaccuracies within the entire hysteresis curve. In order to always start the remagnetization process from a specific reference point on the hysteresis curve, at least every second remagnetization process (as in the example from FIG. 3) can be carried out on a comparator-controlled basis, once the core has been magnetized into saturation.

FIG. 5*c* shows a variant of the method of operation illustrated in FIG. 5*b*, by means of which an even greater reduction can be achieved in the current draw and the power consumption in the partial hysteresis mode. In contrast to the variant from FIG. 5*b*, no new remagnetization cycle starts at a time $t_0$ after the end of one period of the primary current signal, and instead, the voltage source Q is switched off for a time interval $t_{STANDBY}$ at the time $t_0$. At a time $t_1$, at the end of this pause, the voltage source Q is switched on again with the opposite polarity, and a new remagnetization process is started. The magnetization of the core 10 is then continued by the control and measurement unit 20 for a specific time period $\Delta t_+$ to the time $t_2$, after which the polarity of the voltage source Q is reversed again. At the time $t_2$, the core has not yet been completely remagnetized and the magnetization change $\Delta M$ which has been carried out is around 20% to 30% of the maximum possible magnetization change for complete remagnetization. The time $t_2$ is followed by a further, on this occasion complete, remagnetization process as far as the (negative) saturation limit in order, as already mentioned, to once again reach a defined reference point on the hysteresis characteristic.

Otherwise, a sensor which operates on the basis of the partial hysteresis method operates in the same way as that already described with reference to FIGS. 2 and 3. The only difference is that only the remagnetization in one direction is controlled by a comparator, as in the case of the method from FIG. 2, and the remagnetization in the other direction is carried out on a time-controlled basis by presetting the respective time interval $\Delta t_+$ or $\Delta t_-$, as a result of which the magnetization change $\Delta M$ is adjusted in accordance with equation 5b.

Analogously to the situation described above, in which the voltage amplitude US is adapted, in the case of the partial hysteresis method, the magnetization change $\Delta M$ over the time interval $\Delta t_+$ (or $\Delta t_-$) can be adapted, for example by means of a control signal CTR from the measurement and control unit 20, such that the oscillation frequency $f_{SENSOR}$ of the current sensor arrangement is varied continuously during operation. In this case as well, the sensor frequency $f_{SENSOR}$ can be varied by varying the magnetization change $\Delta M$ and/or the time at which the polarity of the voltage source Q is reversed randomly or on the basis on a specific frequency pattern.

Analogously to the amplitude modulation of the voltage $U_S$ from the current source Q as described above, in the case of the partial hysteresis method, the magnetization change $\Delta M$ can be modulated by modulation of the time interval $\Delta t_+$ or $\Delta t_-$. In order to frequency-modulate the sensor frequency $f_{SENSOR}$, the time at which the polarity of the voltage source Q is reversed can be modulated about a mean value. If the frequency $f_S$ of a disturbance 50 (cf. FIG. 4) is known, the sensor frequency $f_{SENSOR}$ can be adjusted such that it or an integer multiple of it differs from the frequency $f_S$ of the disturbance 50 to such an extent that the resultant beating occurs in a frequency range which is not relevant for the measurement.

As an alternative to variation of the time interval $\Delta t_+$ or $\Delta t_-$, in the example shown in FIG. 5*c*, the pause time $t_{STANDBY}$ is also varied, in order to vary the sensor frequency.

FIG. 6 shows an example of one practical implementation of the sensor arrangement shown in FIG. 1. The voltage source Q (designated by the elements within the dashed-line box) is formed by two push-pull output stages A1 and A2 with a low output impedance, which are supplied via a voltage regulator REG. Each connection of the secondary winding 2 is connected to a respective output of one of the two output stages A1 and A2 as shown in FIG. 6. The shunt resistor $R_{SH}$ is connected in the power supply path to the output stages, in the present case one connection of the shunt resistor $R_{SH}$ is connected to ground potential in order to obtain a ground-related current signal $U_{SH}$. The current signal $U_{SH}$, that is to say the voltage dropped across the shunt resistor $R_{SH}$, is supplied to the measurement and control unit 20. The inputs of the push-pull output stages are connected to a respective I/O port of the measurement and control unit 20, and are always driven in opposite senses.

A low-pass filter LP can optionally be connected in the power supply path to the output stages, in order to average the current in the supply lines and to limit the maximum current draw which must be provided from the voltage supply source $U_B$. The peak current is provided from the capacitor, and the voltage supply source $U_B$ has to provide only the consumed power loss. The majority of the reactive current for remagnetization of the core is fed back into the capacitor again. In the simplest case, the low-pass filter may comprise a capacitor and a resistor (RC element). The resistor may also be replaced by a diode.

The measurement and control unit 20 also has an amplifier OP for amplification of the current measurement signal $U_{SH}$. By way of example, this is supplied to an analog-to-digital converter (ADC), in order to obtain a digital measured value. In order to determine the time of remagnetization of the soft-magnetic core 10, the measurement and control unit 20 may also have a comparator K, which compares the current measurement signal $U_{SH}$ with a reference signal $U_{REF}$, which represents the maximum secondary current value $i_{SMAX}$.

Figure 7:
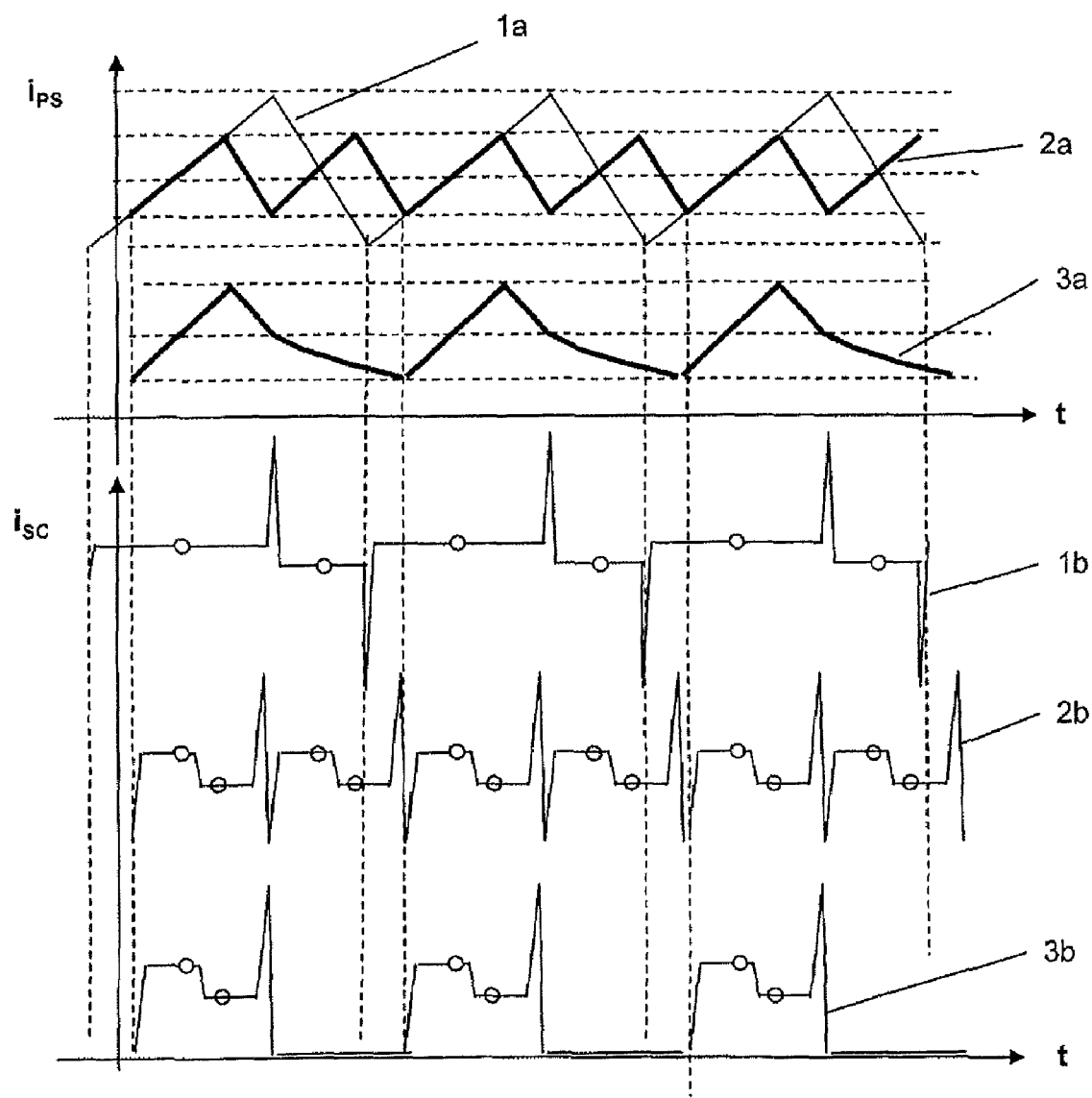
FIG. 7 is a graph which shows the signal profile of the supply current and of the current in the sensor winding of a conventional current sensor, a current sensor according to an embodiment described herein and an alternative embodiment of a current sensor described herein.

In this context, FIG. 7 shows the signal profile of the supply current $i_{PS}$ and of the current $i_{SC}$ in the sensor winding plotted against time t for a current sensor (curves 1a and 1b), an embodiment of a current sensor described herein (2a and 2b) and an alternative embodiment of a current sensor described herein (3a and 3b). As described above, the alternative embodiment is such that the voltage source is switched off at least once at a time as soon as the ferromagnetic core reaches its saturation magnetization, and the voltage source is switched on again, with the opposite polarity, once a pause time has elapsed.

The invention having been disclosed by reference to certain specific embodiments, it will be understood that these specific embodiments are not limiting of the scope of the appended claims.

What is claimed is:

1. A current sensor for measurement of a primary current in a primary conductor, comprising:
    a secondary conductor;
    a ferromagnetic core magnetically coupled to the secondary conductor, and adapted for magnetic coupling of the primary conductor to the secondary conductor;
    a drive device, which is electrically connected to the secondary conductor, comprising:
        a controlled bipolar voltage source which is electrically connected to the secondary conductor and adapted to provide a bipolar voltage of a specific amplitude, such that a resultant secondary current flowing in the secondary conductor causes remagnetization of the ferromagnetic core; and
        a control device coupled with the controlled bipolar voltage source, so that the control device reverses the polarity of the controlled bipolar voltage source at least once at a time during remagnetization of the ferromagnetic core which occurs before that time at which the ferromagnetic core reaches its saturation magnetization; and a measurement device configured to determine the primary current as a function of the secondary current measured before and after the control device reverses polarity of the controlled bipolar voltage, and further configured to average the secondary current measurement so that hysteresis error caused by the secondary current is eliminated.

2. The current sensor as claimed in claim 1, wherein the control device is coupled with the controlled bipolar voltage source in such a way that the control device can switch off the controlled bipolar voltage source at least once at a time as soon as the ferromagnetic core reaches its saturation magnetization, and can switch the voltage source on again with the opposite polarity after an elapsed pause time.

3. The current sensor as claimed in claim 1, wherein the control device is coupled with the controlled bipolar voltage source in such a way that the control device reverses the polarity of the voltage source at least once at a time when, or just after, the ferromagnetic core reaches its saturation magnetization.

4. The current sensor as claimed in claim 1, wherein the bipolar controlled voltage source comprises:
    a supply voltage source; and
    a low-pass filter electrically connected to the supply voltage source in such a way that the low-pass filter limits the maximum load current which can be provided by the supply voltage source.

5. The current sensor as claimed in claim 1, wherein the control device is coupled with the controlled bipolar voltage source in such a way that the control device varies a sensor frequency of the secondary current during the operation of the current sensor.

6. The current sensor as claimed in claim 5, wherein the control device is coupled with the controlled bipolar voltage source in such a way that the control device varies the sensor frequency stochastically.

7. The current sensor as claimed in claim 5, wherein the control device is coupled with the controlled bipolar voltage source in such a way that the control device varies the sensor frequency in accordance with a specific frequency pattern.

8. The current sensor as claimed in claim 5, wherein the primary current has signal components at a specific signal frequency, and wherein the control device is coupled with the controlled bipolar voltage source in such a way that the control device varies the sensor frequency as a function of the signal frequency such that the sensor frequency, or an integer multiple of it, differs from the signal frequency.

9. The current sensor as claimed in claim 5, wherein the control device is coupled with the controlled bipolar voltage source in such a way that the control device varies the voltage amplitude of the voltage source, and thereby varies the sensor frequency.

10. The current sensor as claimed in claim 5, wherein the control device is coupled with the bipolar voltage source in such a way that the control device varies the time at which the voltage source polarity is reversed, and thereby varies the sensor frequency.

11. A method for measuring a primary current in a primary conductor which is magnetically coupled to a secondary conductor via a ferromagnetic core, comprising:
    applying a voltage of a specific amplitude to the secondary conductors sufficient to cause a secondary current flow in the secondary conductor and to remagnetize the ferromagnetic core;
    measuring the secondary current during the remagnetization of the core in order to obtain a first measured value;
    reversing polarity of the applied voltage at least once at a time which occurs before that time at which the ferromagnetic core reaches its saturation magnetization, causing a secondary current to flow and renewing remagnetization of the ferromagnetic core;

measuring the secondary current during the renewed remagnetization of the ferromagnetic core, thereby obtaining a second measured value;

calculating the primary current as a function of the first and the second measured value, the function including averaging the first and the second measured value, thereby eliminating hysteresis error caused by the secondary current.

12. The method as claimed in claim 11, wherein the reversing polarity of the applied voltage is carried out at least once at a time when, or just after, the ferromagnetic core reaches its saturation magnetization.

13. The method as claimed in claim 11, further comprising:
switching off the applied voltage at least once at a time when, or just after, the ferromagnetic core reaches its saturation magnetization, and
switching on the applied voltage again with opposite polarity after an elapsed pause time.

14. The method as claimed in claim 11, wherein the secondary current is provided by a voltage source circuit comprising a voltage supply source, and further comprising:
low-pass filtering of a supply current of the voltage source circuit, thereby limiting the maximum load current which can be provided by the voltage supply source.

15. The method as claimed in claim 11, wherein the reversing polarity of the voltage occurs at a specific sensor oscillation frequency.

16. The method as claimed in claim 15, wherein the sensor oscillation frequency varies stochastically.

17. The method as claimed in claim 15, wherein the sensor oscillation frequency varies in accordance with a specific frequency pattern.

18. The method as claimed in claim 15, wherein the sensor oscillation frequency varies continuously.

* * * * *